(12) United States Patent
Mileski

(10) Patent No.: US 8,599,078 B1
(45) Date of Patent: Dec. 3, 2013

(54) NEAR-FIELD RF CURRENT PROBE SYSTEM FOR A FLOATING BUOYANT CABLE ANTENNA

(75) Inventor: Paul M. Mileski, Mystic, CT (US)

(73) Assignee: The United States of America as represented by the Secretary of Navy, Washington, DC (US)

( * ) Notice: Subject to any disclaimer, the term of this patent is extended or adjusted under 35 U.S.C. 154(b) by 419 days.

(21) Appl. No.: 13/154,973

(22) Filed: Jun. 7, 2011

(51) Int. Cl.
  *G01R 29/10* (2006.01)

(52) U.S. Cl.
  USPC ............................................. 343/703

(58) Field of Classification Search
  USPC .................... 343/703, 709; 324/306
  See application file for complete search history.

(56) References Cited

U.S. PATENT DOCUMENTS

| | | | | |
|---|---|---|---|---|
| 5,282,318 | A * | 2/1994 | Steiner | 33/355 R |
| 7,994,992 | B1 * | 8/2011 | Tam et al. | 343/709 |
| 2003/0052678 | A1 * | 3/2003 | Gerald et al. | 324/318 |
| 2012/0326711 | A1 * | 12/2012 | Roper et al. | 324/252 |

* cited by examiner

*Primary Examiner* — Seung Lee
(74) *Attorney, Agent, or Firm* — James M. Kasischke; Jean-Paul A. Nasser; Michael P. Stanley

(57) ABSTRACT

A current probe system includes a toroid made from a magnetic material and a wire made from an electrically-conducting material that forms at least one winding about a portion of the toroid. A current is induced in the winding(s) when a time-varying magnetic field is present in the toroid. A float coupled to the toroid floats the system at a water's surface. In use, a buoyant cable antenna is fed through the toroid and the system is moved along the antenna.

20 Claims, 2 Drawing Sheets

NEAR-FIELD RF CURRENT PROBE SYSTEM FOR A FLOATING BUOYANT CABLE ANTENNA

STATEMENT OF GOVERNMENT INTEREST

The invention described herein may be manufactured and used by or for the Government of the United States of America for governmental purposes without the payment of any royalties thereon or therefore.

CROSS REFERENCE TO OTHER PATENT APPLICATIONS

None.

BACKGROUND OF THE INVENTION (1) Field of the Invention

The present invention relates generally to current sensors, and more particularly to an RF current probe system that can measure current flowing along a floating buoyant cable antenna.

(2) Description of the Prior Art

Currently, evaluating the azimuthal radiation pattern of a new or modified buoyant cable antenna requires that the antenna under test be located on water and manually rotated in azimuth during which time the antenna's signal is received/evaluated utilizing equipment located on land. This procedure requires that personnel be in the water to periodically and incrementally re-position the antenna (which can be as long as 150 feet). This can be risky and limited to periods not always practical for testing. The time required to perform this procedure also limits the number of position increments and thus impacts the resolution of the data.

SUMMARY OF THE INVENTION

Accordingly, it is an object of the present invention to provide a system for testing a floating buoyant antenna cable.

Another object of the present invention is to provide a system that simplifies evaluation of a buoyant antenna cable's azimuthal radiation pattern while the buoyant cable antenna is deployed at a water's surface.

Other objects and advantages of the present invention will become more obvious hereinafter in the specification and drawings.

In accordance with the present invention, a current probe system includes a toroid made from a magnetic material that surrounds a spatial region. A wire made from an electrically-conducting material forms at least one winding about a portion of the toroid. A current is induced in the winding(s) when a time-varying magnetic field is present in the core's spatial region. A float coupled to the toroid floats the system at a water's surface. In use, a buoyant cable antenna is fed through the toroid and the system is moved along the antenna.

BRIEF DESCRIPTION OF THE DRAWINGS

Other objects, features and advantages of the present invention will become apparent upon reference to the following description of the preferred embodiments and to the drawings, wherein corresponding reference characters indicate corresponding parts throughout the several views of the drawings and wherein.

DETAILED DESCRIPTION OF THE INVENTION

Figure 1:
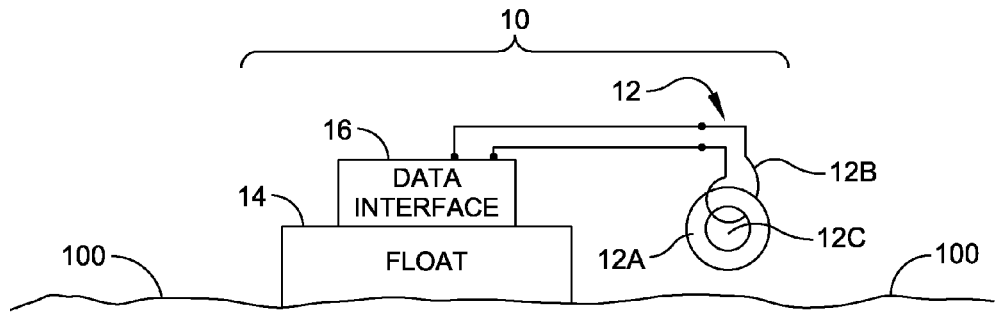
FIG. 1 is a schematic view of a current probe system for measuring current flowing along a floating buoyant cable antenna in accordance with an embodiment of the present invention.

Referring now to the drawings and more particularly to FIG. 1, a current probe system in accordance with an embodiment of the present invention is shown and is referenced generally by numeral 10. Current probe system 10 is used to measure the current flowing along a buoyant cable antenna deployed on a water surface where such current flow provides the necessary information to evaluate the buoyant cable antenna's azimuthal radiation pattern. The current is measured without any moving or manipulation of the buoyant cable antenna.

In general, current probe system 10 includes a toroidal coil 12 and a float 14 coupled to toroidal coil 12 such that toroidal coil 12 is maintained at the water's surface 100 or partially below the surface so that when the toroidal coil 12 is part of a buoyant antenna, it has a minimal effect on the buoyant antenna's attitude when system 10 is deployed on the water. More specifically, toroidal coil 12 has a toroidal core 12A of magnetic material with a wire 12B wound about core 12A one or more times to define a coil winding. The number of windings is chosen such that the impedance resembles an inductor operated well below its self-resonant frequency. Toroidal coil 12 is held substantially perpendicular to the water's surface 100 such that its spatial region 12C defined by core 12A is substantially parallel to the water's surface 100.

In use, a buoyant cable antenna (not shown) in its axial orientation is passed through spatial region 12C with the size of toroidal coil 12 being such that the antenna can be moved there through. As is known in the art of buoyant cable antennas, a circumference-oriented magnetic field is produced by a buoyant cable antenna as current flows there through. The buoyant cable antenna's magnetic field at the portion thereof in spatial region 12C is concentrated by core 12A that, in turn, induces an electric current in wire 12B. The amount of current induced in wire 12B is proportional to the amount of current flowing along the buoyant cable antenna. The induced current can be provided to a data interface 16 for onboard processing and/or transmission as will be explained further below.

Figure 2:
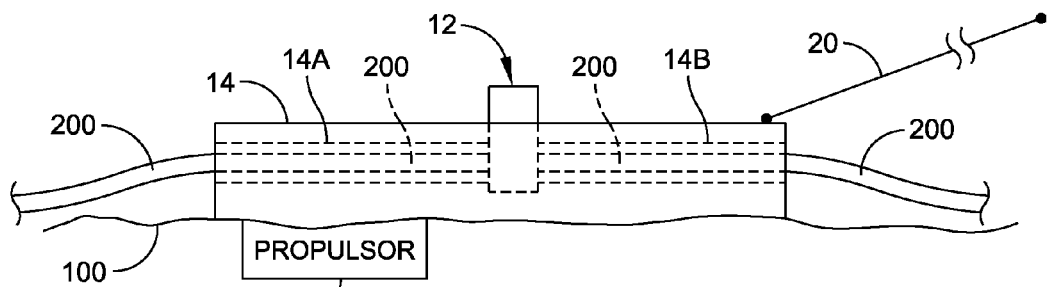
FIG. 2 is a side view of a float and toroidal coil support thereby in accordance with another embodiment of the present invention.

Float 14 is any device or system that can keep toroidal coil 12 oriented at the water's surface 100 as described above. The material used for float 14 and its particular construction can be realized in a variety of ways without departing from the scope of the present invention. For example, FIG. 2 illustrates one embodiment of float 14 that houses and supports toroidal coil 12 while also defining paths/conduits 14A and 14B extending from either side of spatial region 12C of toroidal coil 12. (For clarity of illustration, wire winding 12B and data interface 16 are omitted from FIG. 2.) A buoyant cable antenna 200 floating on the water's surface 100 is led along path/conduit 14A, through spatial region 12C, and then along path/conduit 14B. In this way, float 14 supports/orients toroidal coil 12 while also orienting buoyant cable antenna 200 relative to toroidal coil 12 at the buoyant antenna's natural waterline.

The relationship between paths/conduits 14A/14B and antenna 200 should allow for sliding movement there between so that the combination of toroidal coil 12 and float 14 can be moved along the length antenna 200. Such movement can be made by pulling on a tether line 20 coupled to float 14. The pulling force applied to tether line 20 can be a manual force (e.g., by hand, hand-cranked winch, etc.) or powered force (e.g., motor-driven winch under automatic control, etc.) without departing from the scope of the present invention. Another or additional option is to couple an underwater propulsor 22 to float 14 to generate or aid in the movement of toroidal coil 12/float 14 along antenna 12.

Figure 3:
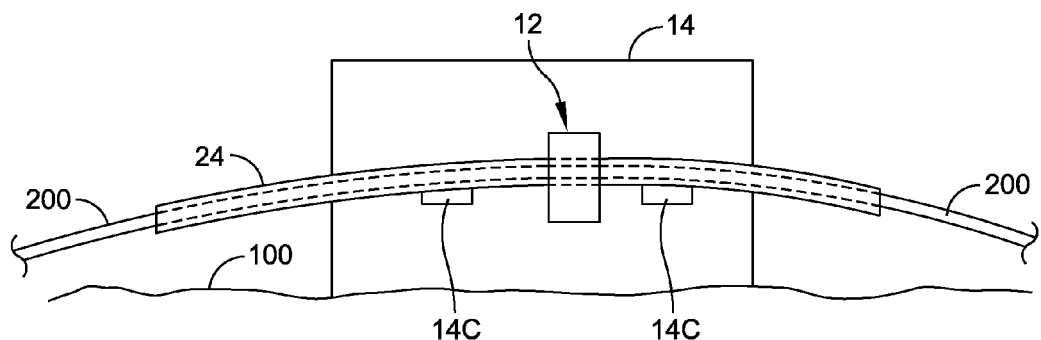
FIG. 3 is a side view of a float supporting an alignment conduit and toroidal coil in accordance with another embodiment of the present invention.

Another support and alignment embodiment of the present invention is illustrated in FIG. 3 where float 14 includes two (or more) support arms 14C extending out there from and over the water's surface 100. Support arms 14C are aligned with one another along a path that is substantially parallel to the water's surface 100 on which float 14 is floating. A hose or conduit 24 made from a non-magnetic material is coupled to and suspended by arms 14C while passing through toroidal core 12. Conduit 24 should have an internal diameter that permits buoyant cable antenna 200 to slide there through as float 14 is moved along antenna 200 as described above.

Figure 4:
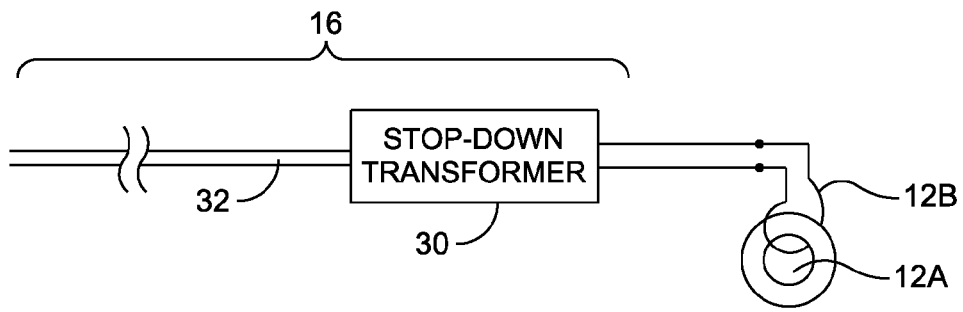
FIG. 4 is a schematic view of a hard-wired data transmission arrangement in accordance with an embodiment of the present invention.

As mentioned above, the current induced in the toroidal coil's winding(s) (i.e., in wire 12B illustrated in FIG. 1) is indicative of the current flowing in the buoyant cable antenna passing through the toroidal coil. The transmission and/or recording of the induced current is handled by data interface 16 as wire 12B is coupled thereto as illustrated in FIG. 1. Three non-limiting realizations of data interface 16 are presented in FIGS. 4-6. These realizations can be used alone or in combination with one another without departing from the scope of the present invention. In FIG. 4, a step-down transformer 30 receives the induced current from wire 12B and an electric signal carrying cable 32 (e.g., a coaxial cable) carries the output of transformer 30 to some remotely-located data collection site (not shown). Transformer 30 isolates wire 12B from cable 32 to reduce the likelihood of ground-loop related effects, reduces the impedance of wire 12B in order to minimize the capacitance related effect created by seawater splash/washover.

Figure 5:
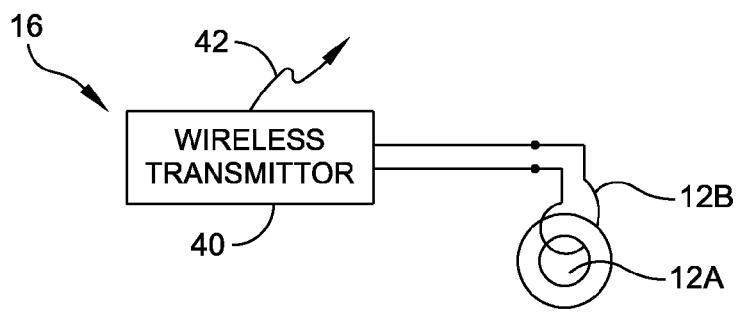
FIG. 5 is a schematic view of a wireless data transmission arrangement in accordance with another embodiment of the present invention.
Figure 6:
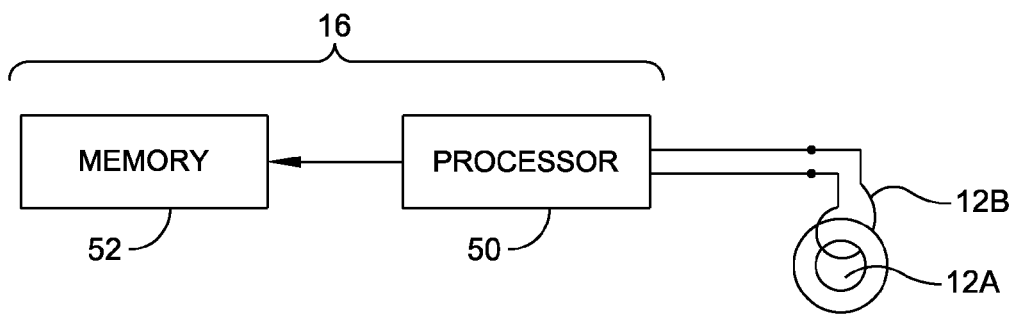
FIG. 6 is a schematic view of an on-board data recording arrangement in accordance with another embodiment of the present invention.

In FIG. 5, data interface 16 is realized by a wireless transmitter 40 coupled to wire 12B where a wireless signal 42 indicative of the induced current is transmitted over the airwaves. In FIG. 6, the induced current flowing in wire 12B is provided to a processor 50 that assembles the current data for storage on a memory 52 for later processing or archival purposes.

The advantages of the present invention are numerous. The azimuthal radiation pattern of a floating buoyant cable antenna is readily evaluated in-sites by measuring the current flowing in the antenna. The cable antenna need not be rotated or otherwise manipulated. The current probe system can be readily moved and operated from a dry location such as a shore or the deck of a ship.

It will be understood that many additional changes in the details, materials, steps and arrangement of parts, which have been herein described and illustrated in order to explain the nature of the invention, may be made by those skilled in the art within the principle and scope of the invention as expressed in the appended claims.

What is claimed is:

1. A current probe system comprising:
   a toroid made from a magnetic material, said toroid surrounding a spatial region;
   a wire made from an electrically-conducting material, said wire forming at least one winding about a portion of said toroid, wherein a current is induced in said at least one winding when a time-varying magnetic field is present in said spatial region; and
   a float coupled to said toroid and adapted to float at a water's surface.

2. A current probe system as in claim 1, further comprising:
   a transformer mounted on said float and coupled to said wire; and
   an electric signal carrying cable coupled to said transformer.

3. A current probe system as in claim 1, further comprising a wireless transmitter mounted on said float and coupled to said wire for wirelessly transmitting information indicative of said current so-induced.

4. A current probe system as in claim 1, further comprising a recorder mounted on said float and coupled to said wire for recording information indicative of said current so-induced.

5. A current probe system as in claim 1, further comprising means coupled to said float for moving said float along the water's surface.

6. A current probe system as in claim 1, further comprising a tether line coupled to said float.

7. A current probe system as in claim 1, wherein said float defines a conduit leading to and from said spatial region of said toroid.

8. A current probe system as in claim 1, further comprising a conduit made from non-magnetic and non-electrically conducting material, said conduit leading to and a passing through said spatial region of said toroid and extending away from said toroid.

9. A current probe system as in claim 1, further comprising means made from a non-magnetic and non-electrically conducting material and coupled to said float, said means defining a first path leading to said spatial region and second path leading away from said spatial region.

10. A current probe system comprising:
    a toroidal coil having a toroidal core made from a magnetic material and a wire coil made from an electrically-conducting material forming at least one winding about a portion of said core, wherein a current is induced in said at least one winding when a time-varying magnetic field is present in said toroidal core; and
    a float coupled to said toroidal coil and adapted to float at a water's surface while maintaining said toroidal coil above the water's surface and approximately perpendicular thereto.

11. A current probe system as in claim 10, further comprising:
    a transformer mounted on said float and coupled to said wire coil; and
    a coaxial cable coupled to said transformer.

12. A current probe system as in claim 10, further comprising a wireless transmitter mounted on said float and coupled to said wire coil for wirelessly transmitting information indicative of said current so-induced.

13. A current probe system as in claim 10, further comprising a recorder mounted on said float and coupled to said wire coil for recording information indicative of said current so-induced.

14. A current probe system as in claim 10, further comprising means coupled to said float for moving said float along the water's surface.

15. A current probe system as in claim 10, further comprising a tether line coupled to said float.

16. A current probe system as in claim 10, wherein said float defines a conduit leading to and from said core, said conduit defining a path there through that is substantially parallel to the water's surface when said float is at the water's surface.

17. A current probe system as in claim 10, further comprising a conduit made from non-magnetic material, said conduit extending through and away from said core, said conduit defining a path there through that is substantially parallel to the water's surface when said float is at the water's surface.

18. A current probe system as in claim 10, further comprising means made from a non-magnetic material and coupled to said float, said means defining a first path leading to said core and a second path leading away from said core, said first path and said second path being substantially parallel to the water's surface when said float is at the water's surface arranged so as to minimally disturb the floating antenna.

19. A current probe system comprising:
- a toroid made from a magnetic material, said toroid surrounding a spatial region;
- a wire made from an electrically-conducting material, said wire forming at least one winding about a portion of said toroid, wherein a current is induced in said at least one winding when a time-varying magnetic field is present in said spatial region;
- a float coupled to said toroid and adapted to float at a water's surface; and
- a data interface mounted on said float and coupled to said wire for transmitting information indicative of said current so-induced.

20. A current probe system as in claim 19, further comprising:
- a means coupled to said float for moving said float along the water's surface;
- a tether line coupled to said float, wherein said float defines a conduit leading to and from said spatial region of said toroid;
- a conduit made from non-magnetic material, said conduit leading to and a passing through said spatial region of said toroid and extending away from said toroid; and
- a means made from a non-magnetic material and coupled to said float, said means defining a first path leading to said spatial region and second path leading away from said spatial region.

\* \* \* \* \*